United States Patent [19]

Yamamoto

[11] Patent Number: 5,034,590
[45] Date of Patent: Jul. 23, 1991

[54] ELECTRON GUN ARRANGEMENT FOR USE IN THE ELECTRON BEAM EVAPORATION PROCESS

[75] Inventor: Hisashi Yamamoto, Fuchu, Japan

[73] Assignee: Anelva Corporation, Tokyo, Japan

[21] Appl. No.: 557,095

[22] Filed: Jul. 25, 1990

[30] Foreign Application Priority Data

Aug. 2, 1989 [JP] Japan .................................. 1-200985
Mar. 9, 1990 [JP] Japan .............................. 2-24083[U]

[51] Int. Cl.$^5$ .......................................... B23K 15/00
[52] U.S. Cl. ......................... 219/121.15; 373/16
[58] Field of Search .................. 219/121.15, 121.16, 219/121.17, 121.35, 121.12; 373/11–16

[56] References Cited

U.S. PATENT DOCUMENTS

| | | | |
|---|---|---|---|
| 3,472,999 | 10/1969 | Yamamoto et al. | 373/13 X |
| 4,131,753 | 12/1978 | Tsujimoto et al. | 373/11 |
| 4,632,059 | 12/1986 | Flatscher et al. | 219/121.15 X |
| 4,728,777 | 3/1988 | Smith | 373/11 X |
| 4,983,806 | 1/1991 | Harper et al. | 373/11 |

Primary Examiner—C. L. Albritton
Attorney, Agent, or Firm—Wenderoth, Lind & Ponack

[57] ABSTRACT

An electron gun arrangement is for use in the electron beam evaporation process, including the permanent magnet circuit for deflecting the electron beam from its supply source toward its crucible, wherein it further includes electromagnetic coil winding means for sweeping the electron beam to one point to the particular point on the substance to be evaporated. The electromagnetic coil winding means is disposed to surround the permanent magnet circuit.

7 Claims, 8 Drawing Sheets

ELECTRON GUN ARRANGEMENT FOR USE IN THE ELECTRON BEAM EVAPORATION PROCESS

BACKGROUND OF THE INVENTION

1. Field of the Invention

The present invention relates to an electron gun arrangement that may be used in the electron beam evaporation process.

2. Description of the Prior Art

Typically, a conventional evaporation process that forms a thin-film coating on a substrate by using the electron beams occurs in vacuum, and consists of exposing a substance (such as aluminum) to the electron beams, thereby heating the substance until it evaporates, and then forming its thin-film coating on the surface of another substance such as a semiconductor substrate. An electron gun that emits its electron beam toward a crucible where a substance to be deposited is placed has various constructions.

For an application where multi-element thin films are deposited on the substrate, a plurality of electron guns are provided within a vacuum chamber in which the multiple elements or substances to be deposited on a single substrate are allowed to evaporate concurrently by exposing them to the respective electron beams emitted by the corresponding electron guns, and the resulting evaporates are deposited as a thin-film coating on the substrate. For the multiple-electron gun arrangement as described above, it may be understood that when the electron beams from those electron guns are traveling across their respective magnetic fields in order to be deflected by the magnetic fields, those magnetic fields tend to interact magnetically with each other. This interaction may cause the mutual magnetic interference which may have the various accompanying effects. For example, the electron beams may deviate from the center points within the respective crucibles at which they should be directed, it may contain any distortions that may be produced by the mutual interference, or its focusing may be affected. Those effects are undesirable, and should be eliminated.

In order to reduce or eliminate the mutual interference of the participating magnetic fields, an alternative arrangement is known, which includes a plurality of electron guns which are spaced farther apart from each other. This arrangement has some disadvantages, however, in that the equipment must have the larger construction, and the vapor that is produced during the evaporation process within a vacuum chamber may have its directional distribution governed by the cosine law, which may have the adverse effects on the rate at which a thin film coating is being deposited, as well as on its homogeneity.

In the prior patent application (unexamined publication No. 1-149955 in Japan), the inventor of the present application proposed an electron gun arrangement designed to produce its electron beam to evaporate a substance and deposit its thin film coating on a substrate. This electron gun arrangement includes a magnetic circuit having an annular shape in plane and which provides a magnetic field to deflect the electron beam, and a plurality of crucibles arranged along the megnetic circuit and an electron beam supply source for each of the crucibles.

The electron gun arrangement described above, which includes the annular magnetic circuit and the plurality of crucibles and electron beam sources along the magnetic circuit, is specifically designed to solve the problems such as the restrictions on reducing the equipment's physical size, the non-uniformity of the evaporation distribution, etc. In fact, those problems have been eliminated, but there is still a problem. The problem is that the arrangement provides no sweeping function that allows an electron beam to be moved from one point to another while it is directed toward the crucible.

This sweeping function may be eliminated when metals, typically aluminum, that will not be sublimed at relatively low fusing point temperatures, are to be evapolated. For metals having a high fusing point, such as tungsten, molybdenum, and the like, or insulator such as quartz, or other substances that will be sublimed at high fusing point temperatures, the electron beam sweeping function is required since the electron beam must be moved from one point to another, covering the broad range surface of any of those substances within the crucible, not just directed toward a single point, so that an evaporation can occur in the proper manner.

SUMMARY OF THE INVENTION

One object of the present invention is accordingly to provide an electron gun arrangement that provides an electron-beam sweeping function in addition to those functions such as the magnetic circuit, and the plurality of crucibles and electron beam supplies that are contained in the prior art electron gun arrangement. The problems associated with the prior art, particularly the sweeping problem, have been solved.

In one aspect of the present invention, the electron gun arrangement includes a magnetic circuit having an annular shape in plane and which produces a magnetic field for deflecting an electron beam, a plurality of crucibles arranged along the annular magnetic circuit and an electron beam supply source for each of the crucibles, wherein it further includes an additional electromagnetic coil winding assembly that provides the sweeping function for the electron beam.

The electromagnetic coil winding assembly that provides the electron beam sweeping function is arranged outside the magnetic circuit, and consists of a single annular yoke assembly, formed by one or more individual yoke members, having two or more pairs of coil windings. In its variation, the electromagnetic coil winding assembly may comprise individual yokes arranged opposite their respective electron beam supply sources, each of those individual yokes having one coil winding. The individual yoke members forming the single annular yoke assembly or the individual yokes may be formed of a bulk of ferromagnetic material like pure iron. For applications where the high-velocity sweeping function is required, it is desirable that the single annular yoke assembly or the individual yokes is formed of a plurality of grain-oriented magnetic Si-steel sheets which are laminated and electrically isolated from each other.

In the preferred embodiment of the electron gun arrangement, when an electron beam from a particular electron beam supply source is traveling across the magnetic field created by the magnetic circuit, the electron beam can be influenced by the sweeping action of the electromagnetic coil winding assembly so that it can be swept to onepoint to the location at which it should be directed, or can be moved from one point to another over the surface of the substance being processed.

In one variation of the electron gun arrangement, the electromagnetic coil winding assembly may consist of a single annular yoke assembly formed by one or more individual yoke members, and having two or more pairs of coil windings thereon, wherein the individual electron beams from the respective electron beam supply sources may be placed under the magnetic forces of the magnetic fields that are created by the magnetic circuit, and can be swept concurrently by the sweeping action provided by the interacting magnetic fields of the electromagnetic coil winding assmbly.

In another variation, the electromagnetic coil winding assembly may include individual yokes arranged opposite the respective electron beam supply sources and each carrying a single coil winding, wherein the coil windings on the individual yokes may be energized independently to produce their respective magnetic fields, so that the respective electron beams may be swept independently under the sweeping action of the respective magnetic fields.

BRIEF DESCRIPTION OF THE DRAWINGS

Those and other objects, features and advantages of the present invention will become more apprarent from the detailed description of several preferred embodiments that follows by reference to the accompanying drawings, in which:

FIG. 8 is a plan view explaining how an electron beam is swept from one point to another when it is traveling across the magnetic field produced in FIG. 7a.

DETAILED DESCRIPTION OF THE PREFERRED EMBODIMENTS

Referring to the accompanying drawings, each of the various preferred embodiments of the present invention is described below.

Figure 1:
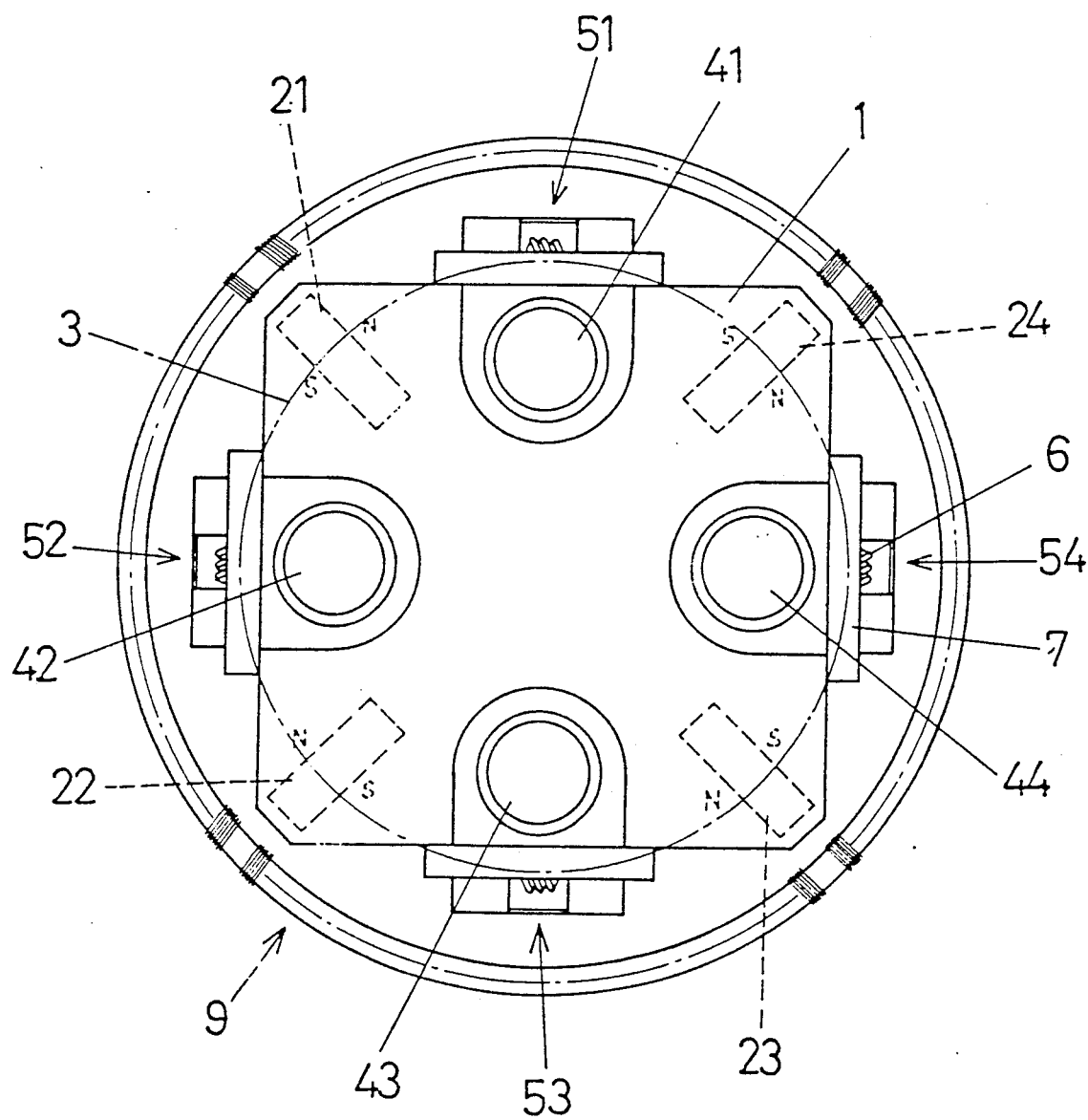
FIG. 1 is a plan view showing the first preferred embodiment of the present invention.
Figure 2:
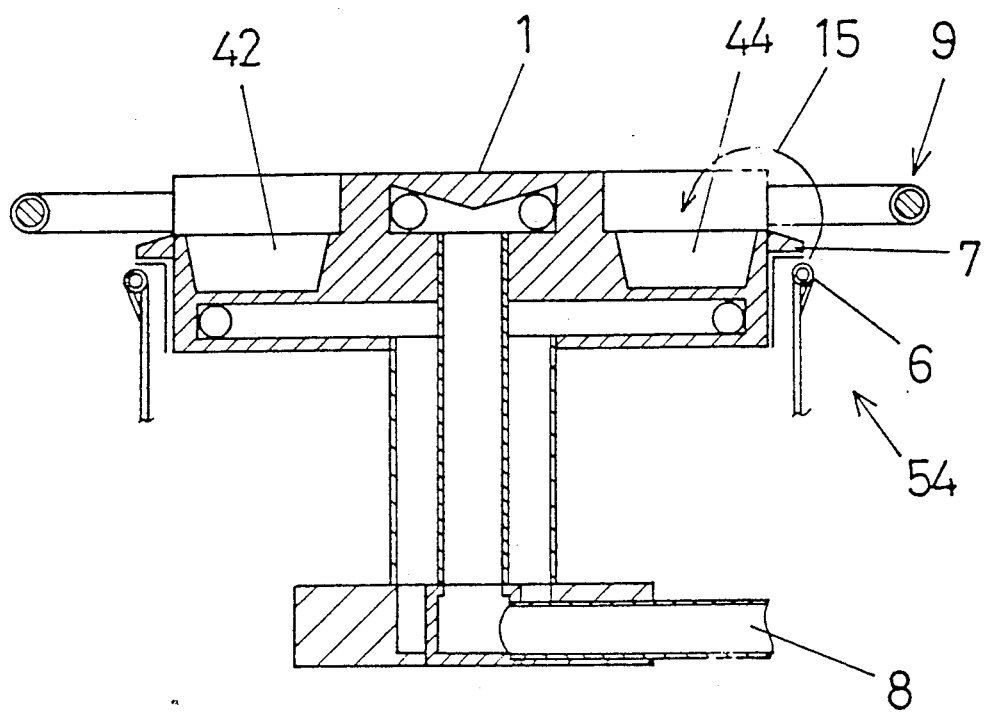
FIG. 2 is a longitudinal section view showing some sections of the first preferred embodiment shown in FIG. 1.
Figure 3:
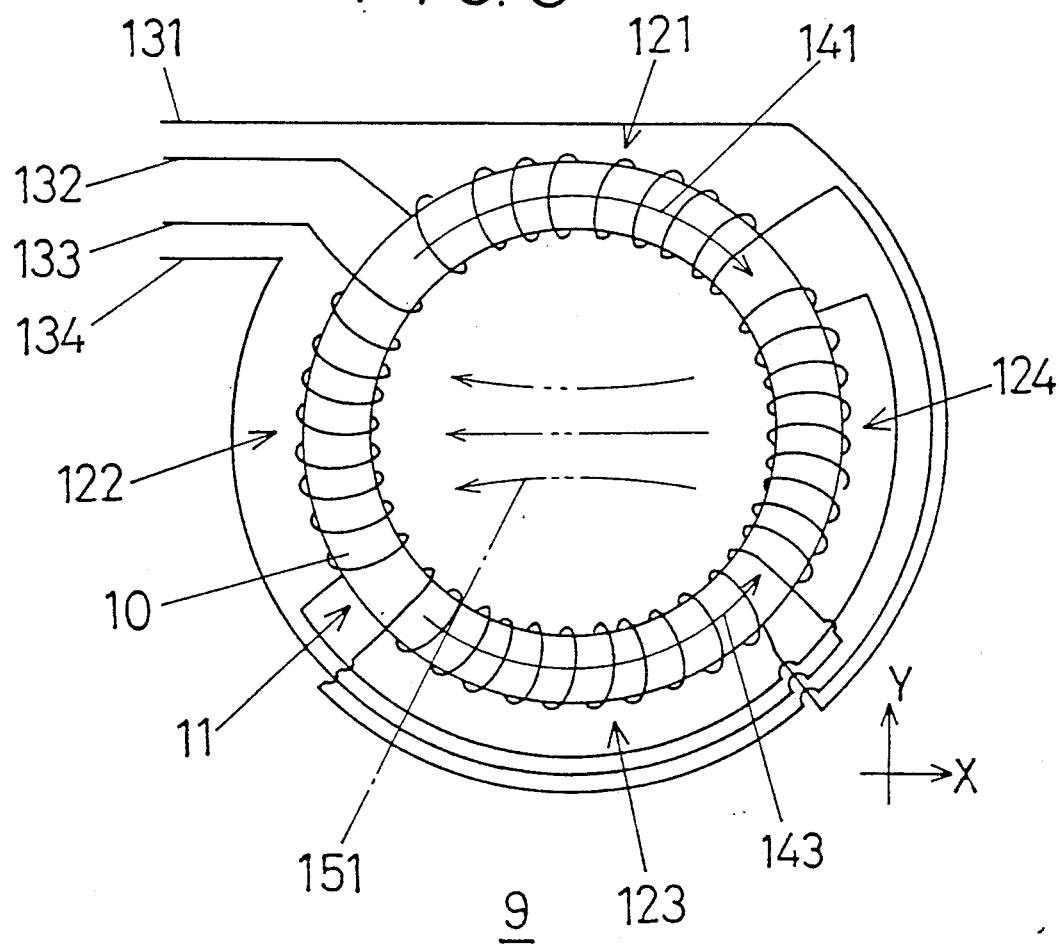
FIG. 3 is a diagram illustrating the electromagnetic coil winding assembly in the first preferred embodiment, which will be referenced when its structure and operation are described.

Referring first to FIG. 1 through FIG. 3, the first embodiment is described. A water-cooled hearth 1 has a substantially square shape in plane, and contains four permanent magnets 21, 22, 23, 24 as shown in this case which are buried at the four corners of the hearth 1. Those four permanent magnets 21, etc. form a magnetic circuit 3 which has an annular configuration in plane as shown. The water-cooled hearth 1 also includes four crucibles 41, 42, 43, 44 on the four sides thereof, each of which is located on the middle way of the corresponding side, extending above it. Each of the crucibles 41, etc. has an electron beam supply source 51, 52, 53, 54 which is located outside the respective crucible. Each of the electron beam supply source 51, etc. includes a filament 6 and an electrode 7. As seen from FIG. 2, a cooling water circulates through its path 8 for cooling the hearth 1.

The annular magnetic circuit thus formed provides a magnetic field across each crucible, which deflects an electron beam as if a single electron gun would do. In other words, each electron beam from the respective electron beam supply source can be deflected toward the respective crucible by the action of the respective magnetic field, independently of the other magnetic fields. That is, all the participating magnetic fields can deflect their respective electron beams independently without their mutual magnetic interference. Thus, the each electron beam from the respective electron beam supply source can be focused on a substance of the respective crusibles.

Fundamentally, the arrangement of the permanent magnets such as that shown in FIG. 1, etc. provides the similar deflecting effects as in the case of the arrangement of the permanent magnets in the prior application mentioned earlier (Jp Pat. unexamined publication No. 1-1449955). It should be understood, however, that the embodiment as typically shown in FIG. 1 can better meet the sweeping requirements.

As it may be seen from FIG. 1, the electron gun arrangement according to the present invention includes the parts or elements that are similar to those in the prior arrangement, and further includes an annular electromagnetic coil winding assembly 9 that surrounds the water-cooled hearth 1 in a circular form in plane. As its details are shown in FIG. 3, the electromagnetic coil winding assembly 9 comprises a single annular yoke 11 formed by a single yoke member 10 carrying four coil windings 121, 122, 123, 124. The two coil windings which are diametrically opposed form a pair, such as 121 and 123, and 122 and 124. The coil windings in each pair are set up to produce the magnetic lines of force in the opposite directions. If current flows through leads 131 and 132, energizing the coil windings 121 and 123, respectively, the coil winding 121 produces the magnetic lines of force in the direction of an arrow 141, while the coil winding 123 produces the magnetic lines of force in the direction of an arrow 143 which is opposite to that for the coil winding 121 as shown. This results in producing the magnetic lines of force as shown by 151 in FIG. 3. This applies to the other pair of coil windings 122 and 124 when current flows through leads 133 and 134.

In accordance with the electron gun arrangement described so far, the electron beams emitted by the respective electron beam supply sources follow the respective paths as defined by 15 in FIG. 2, impinging upon the nearly central area within the respective crucibles 41, 42, 43, 44. When the electromagnetic coil assembly 9 conducts current, specifically the individual coil windings 121, 122, 123, 124 are energized, each pair of the coil windings produces the resultant magnetic field, respectively. When the electron beams are traveling across the respective magnetic fields, they are influenced by the action of the magnetic fields so that they may be swept toward the respective points at which they should be directed.

It may be understood from the preceding description that the current flows through the leads 131 and 132 energize the coil windings 121 and 123, which produce the respective magnetic lines of force in the directions of arrows 141 and 143. Thus, when the electron beam is traveling across the magnetic fields created by the coil windings 121 and 123, it is influenced by the magnetic lines of force across which the electron beam undergoes the magnetic force of the direction of X axis as indicated by 151. Similarly, the current flows through the leads 133 and 134 energize the coil windings 122 and 124, which produce the resepctive magnetic lines of force across which the electron beam undergoes the magnetic force of the direction of Y axis which is orthogonal to that of the magnetic lines of force 151. The magnetic lines of force that enable the electron beams to be swept in all possible directions can be produced by controlling the direction and magnitude of the current flows through each pair of coil windings 121, 123, and 122, 124. The ability of controlling the direction and magnitude of the magnetic lines of force provides for the flexible sweeping function that allows the elctron beams from the resepctive electron beam supply sources 51, etc. to be directed at all possible points within the respective crucibles 41, etc.

The following description is provided to explain how the electron beams are swept when they are traveling across the magnetic fields produced by the respective coil winding pairs.

Figure 7:
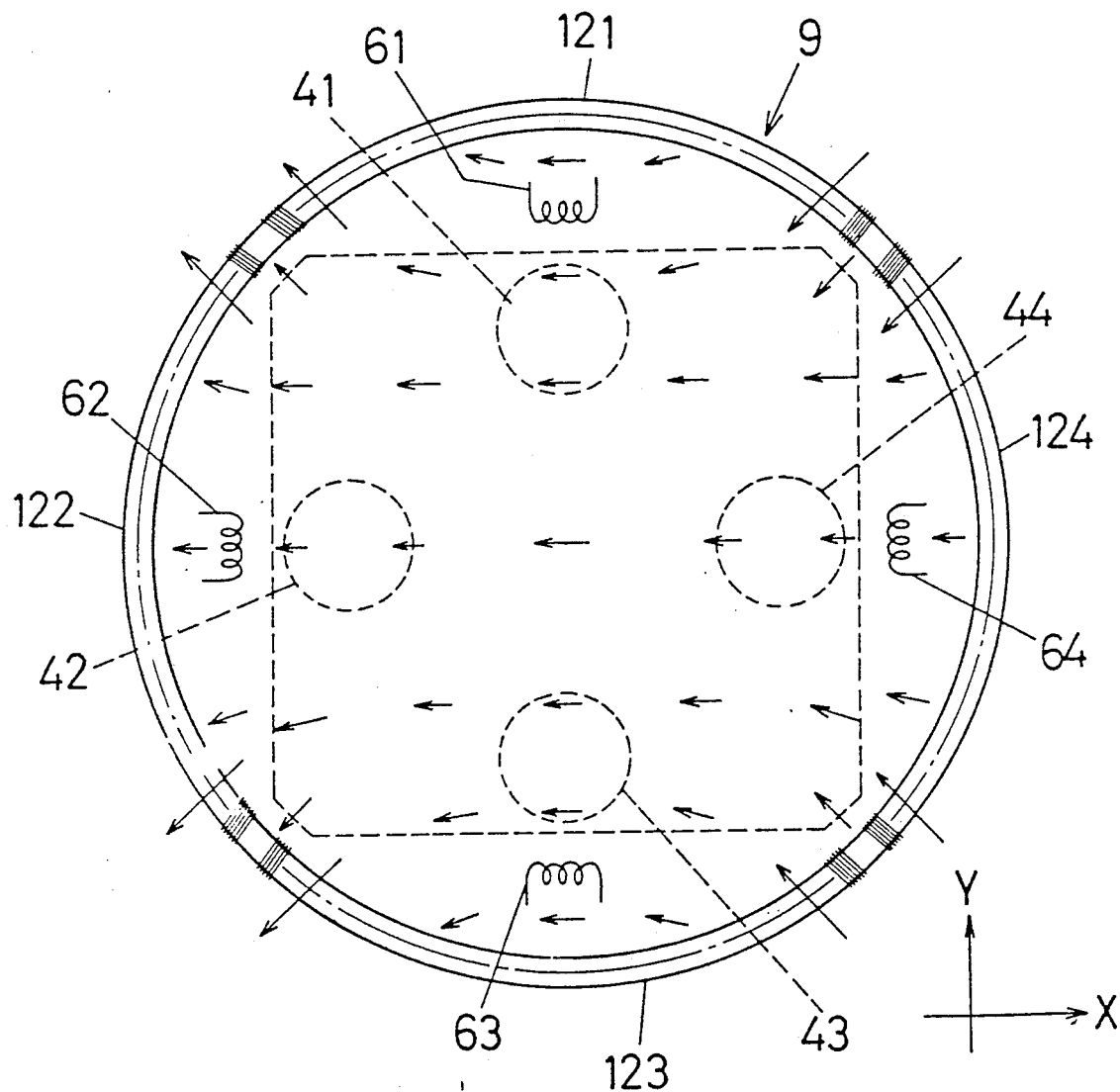
FIGS. 7 and 7a are shematic diagrams illustrating the magnetic lines of force produced by the electromagnetic coil winding assembly.

Referring first to FIG. 7, there are shown the magnetic lines of force in the magnetic field produced by the pair of the coil windings 121 and 123 (where the magnetic circuit 3 formed by the permanent magnets 21, etc. is not provided for permitting the electron beams to be deflected).

In this case, it is found that when current of 1A flows through each of the coil windings 121 and 123, they develop the magnetic fields having different strengths, depending upon the different locations. Specifically, the magnetic field has the strength of 8 Gauss at the central area within the water-cooled hearth 1, the strength of 10 Gauss at the center through each of the crucibles 42 and 44, the strength of 18 Gauss at the center in each of the filaments 62 and 64, the strength of 9 Gauss at the center through each of the crucibles 41 and 43, and the strength of 12 Gauss at the center in each of the filaments 61 and 63, respectively.

Figure 7A:
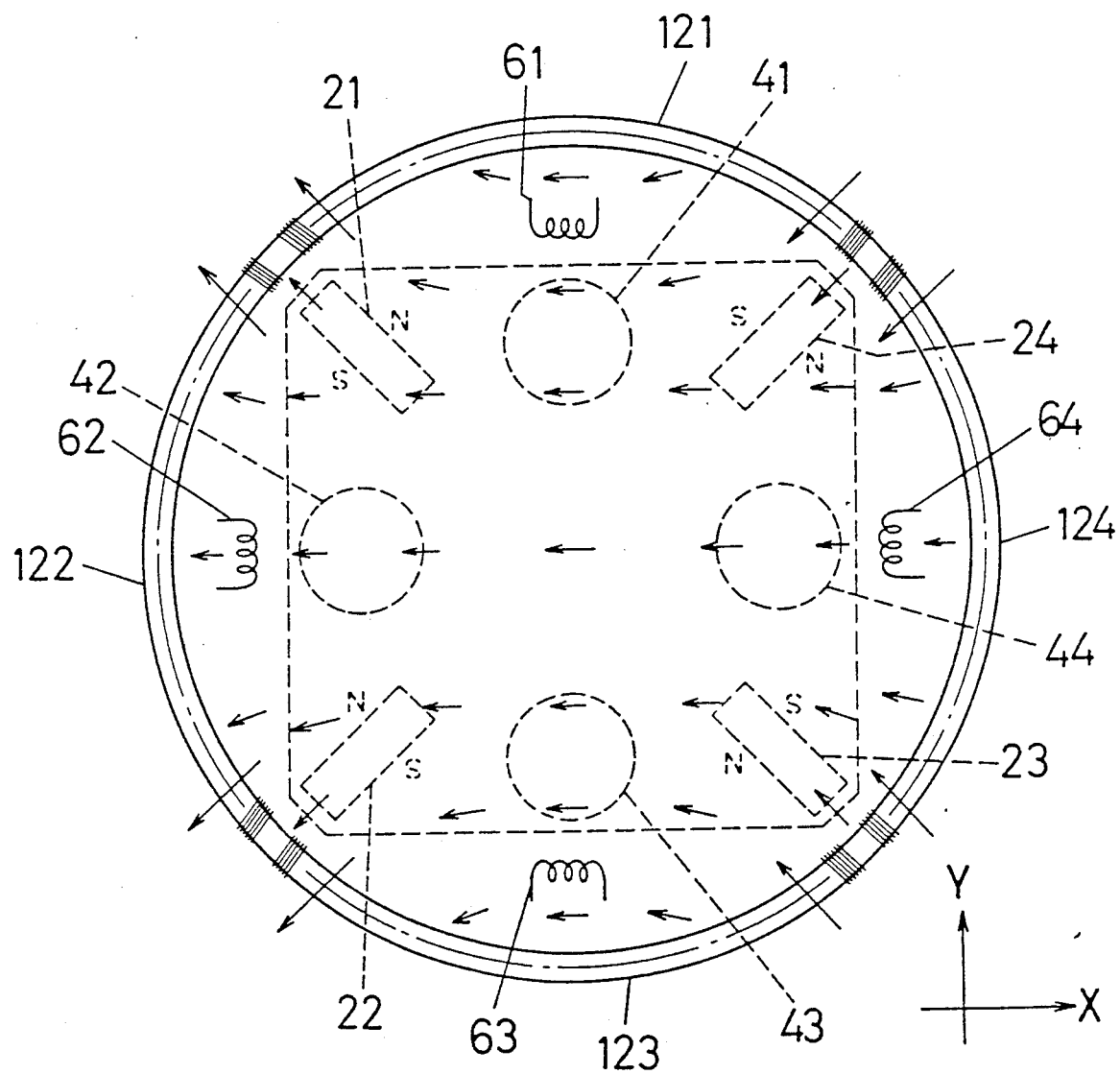

Referring next to FIG. 7a, the water-cooled hearth 1 contains the permanent magnets 21, etc. forming the annular magnetic circuit 3 dedicated for deflecting the electron beams. In this case, the magnetic fields developed by the magnetic circuit 3 superpose the magnetic fields developed by the coil windings 121 and 123.

The following description discusses how the electron beam sweeping occurs so that it can pinpoint to the location at which the electron beam should be directed.

In the area located near the crucible 41, the magnetice field developed by the annular magnetic circuit 3 is weakened the strength by those developed by the coil windings 121 and 123, whereas in the area located near the crucible 43, its strength is strengthened. Thus, the radius of travel of the electron beam directed toward the crucible 41 is increased, whereas the radius of travel for the electron beam directed toward the crucible 43 is reduced. The electron beams are thus swept toward the points as indicated by 41' and 43' in FIG. 8.

Near the crucibles 42 and 44, the magnetic field developed by the magnetic circuit 3 and the magnetic field developed by the coil windings 121 and 123 have the directions orgothonal to each other. As such, the electron beams directed toward the respective crucibles 42 and 44 will have no change in their respective travel radius, but will undergo the magnetic force in the direction of Y axis.

This means that the force exerted upon the electron beam when it is emitted from its filament, and the force exerted upon it when it is directed toward its crucible have the opposite directions (because the electron beam travels in the opposite direction). At the centers of the filaments 62 and 64, the magnetic field has the strength of 18 Gauss, and at the centers in the crucibles 42 and 44, the magnetic field has the strength of 10 Gauss. There is a difference between those two strengths, and the electron beam will undergo the force in the direction of Y axis by the amount equal to this difference. The force is exerted upon the electron beam in the direction of the arrow 42' in FIG. 8 when the electron beam is traveling near the crucible 42, and the force is exerted upon the electron beam in the direction of the arrow 44' in FIG. 8 when it is traveling near the crucible 44. The coil windings 122 and 124 (connected to provide the magnetic fields in the opposite directions) produce the magnetic fields in the direction that is turned by 90° relative to that shown in FIG. 7. This is because each coil winding has the symmetry of rotation through four 90° turns. The superposition of the magnetic fields developed by the coil windings 122 and 124 upon those developed by the annular magnetic circuit thus causes the electron beams to be swept in the direction of the arrows 41", 42", 43" and 44" in FIG. 8, respectively.

As it may be appreciated from the preceding description, the directions and strengths of the respective magnetic fields developed by the respective pairs of coil windings 121, 123 and 122, 124 can be varied, and the respective magnetic fields (deflecting magnetic field and sweeping magnetic field) can interact with each other, in order to enable the electron beams to be swept flexibly. This sweeping action can be achieved by conducting the appropriate AC current through each of the coil windings.

To demonstrate the effect of the electron gun arrangement in the embodiment described so far, a typical experiment was carried out. The following results help understand the unique features of the present invention.

Figure 8:
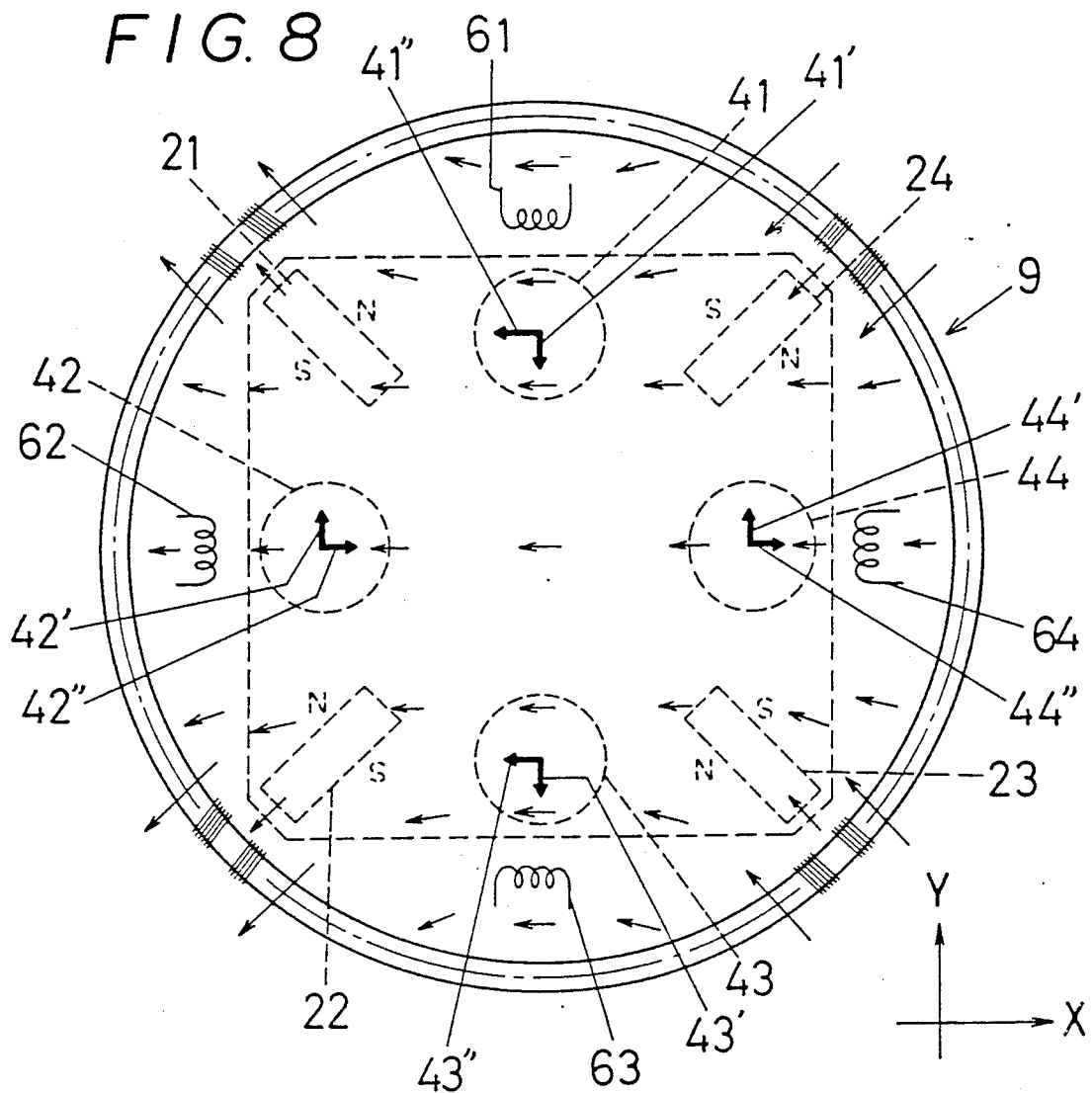

In FIG. 8, the annular magnetic circuit 3 is set up to produce the magnetic field strength of about 200 Gauss, and the coil winding assemblies 121 and 123 each carry 200 turns of coil. A current of 3A flows through each coil winding. When the coil windings are then energized, they produce the magnetic fields across which the electron beams are swept from the original point when no current flows through the coil windings toward the new point, by the distance of about 10 mm in the direction of arrows 41', 43' for the crucibles 41, 43 and by the distance of about 7 mm in the direction of arrows 42', 44' for the crucibles 42, 44.

Figure 6:
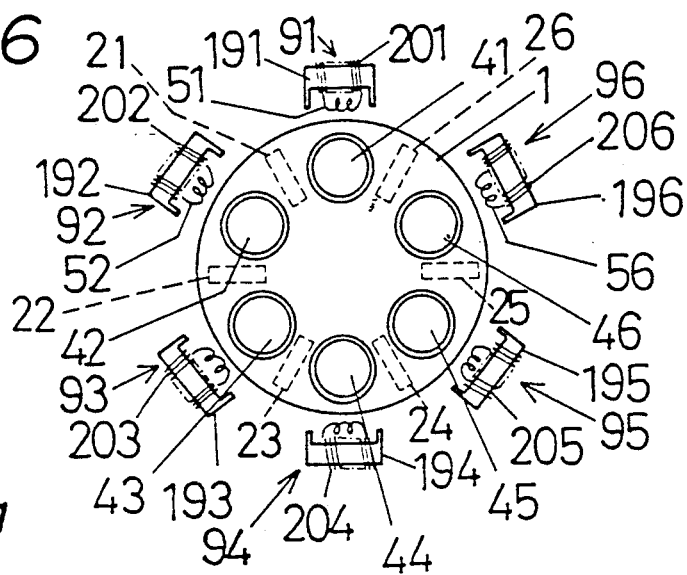
FIGS. 6, 6a, and 6b are plan views showing the fourth preferred embodiment of the present invention.

In the embodiment shown in FIGS. 1 through 3 and described so far, the electron gun arrangement includes the set of four crucibles 41, etc. and the set of four electron beam supply sources 51, etc., respectively. It should be understood that those numbers may be varied, such as to three, five, six (as shown in FIG. 6), or more than six. In those variations, the similar sweeping action can also be achieved.

Figure 4:
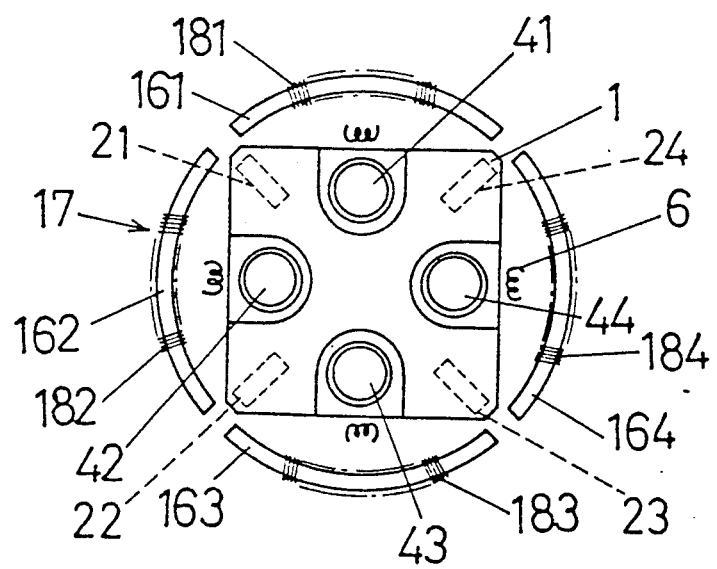
FIG. 4 is a plan view showing the second preferred embodiment of the present invention.
Figure 5:
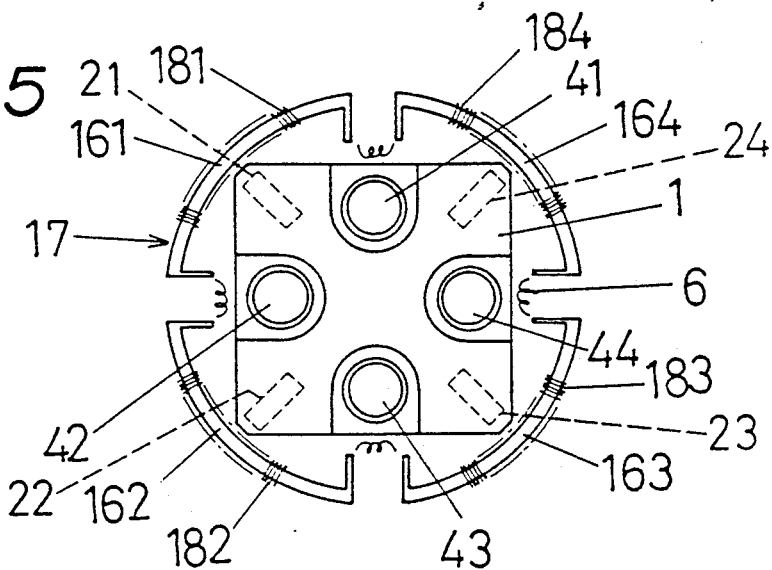
FIGS. 5, 5a, and 5b are plan views showing the third preferred embodiment of the present invention.

Referring next to FIGS. 4 and 5, another preferred embodiment is described, in which the electromagnetic coil winding assembly 9 comprises several individual yokes.

In FIG. 4, the electron gun arrangement includes a water-cooled hearth 1, which is surrounded by an annular yoke assembly 17 formed by individual arcuate yoke members 161, 162, 163, 164 separated from each other and each facing opposite the corresponding electron beam supply source 51, 52, 53, 54. As in the preceding embodiment, two yokes which are diametrically opposed form a pair, such as yokes 161 and 163 forming one pair, and yokes 162 and 164 forming one pair. Each yoke carries a coil winding 181, 182, 183, 184. The electromagnetic coil winding assembly thus formed provides the sweeping function.

Each pair of coil windings provides the magnetic field, and the electron beam across the magnetic field may be swept to pinpoint to a new location, in the same manner as described with reference to FIGS. 7, 7a, and 8.

In FIG. 5, the electron gun arrangement is similar to that shown in FIG. 4, except that each of the arcuate yoke members 161, 162, 163, 164 is placed between any two adjacent electron beam supply sources.

Figure 5A:
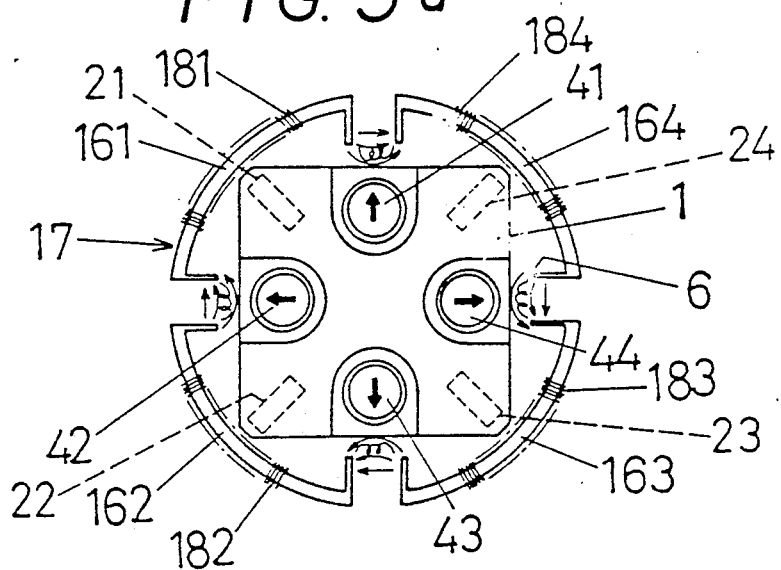
Figure 5B:
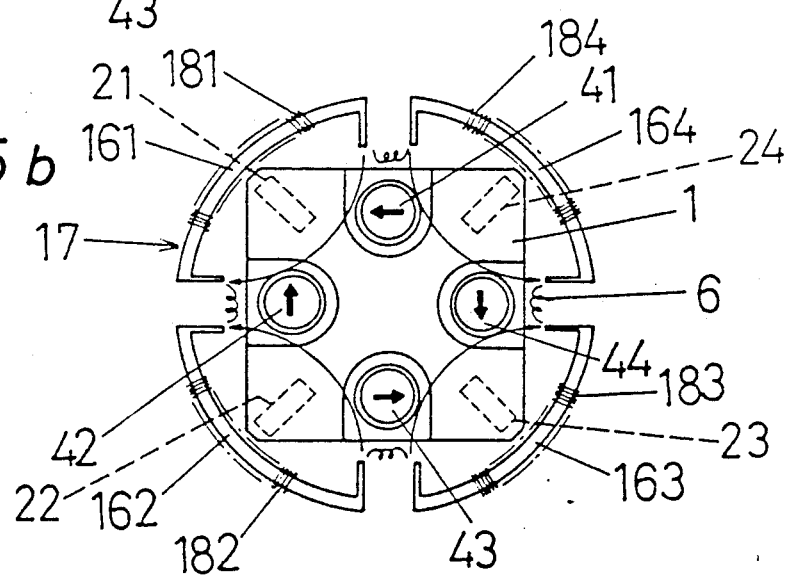

In this variation, the coil windings on any two adjacent yokes members may produce the respective magnetic fields in the same direction, and then the electron beams traveling across the magnetic fields may be swept in the direction of an arrow in FIG. 5a. Conversely, the coil windings on any two adjacent yoke members may produce the respective magnetic fields in the opposite directions, repelling against each other, and then the electron beams traveling across the magnetic fields may be swept in the direction of an arrow in FIG. 5b.

In the second embodiment and any variation thereof, the electron beams traveling across the magnetic fields may be influenced by the sweeping magnetic lines of force produced by the relevant coil windings. Thus, the sweeping action may be achieved as flexibly as that in the preceding embodiment in FIG. 1.

In the embodiment shown in FIG. 6, one electromagnetic coil winding assembly is provided for each of the electron beam supply sources.

Those electromagnetic coil winding assemblies are independent of each other, and each corresponds to the respective electron beam supply source. As shown in FIG. 6, each of the electromagnetic coil winding assemblies 91, 92, ... 96 is disposed outside the corresponding electron beam supply source 51, 52, ... 56, and is formed of each respective one of the yoke members 191, 192, ... 196 carrying each respective one of the coil windings 201, 202, ... 206.

Figure 6A:
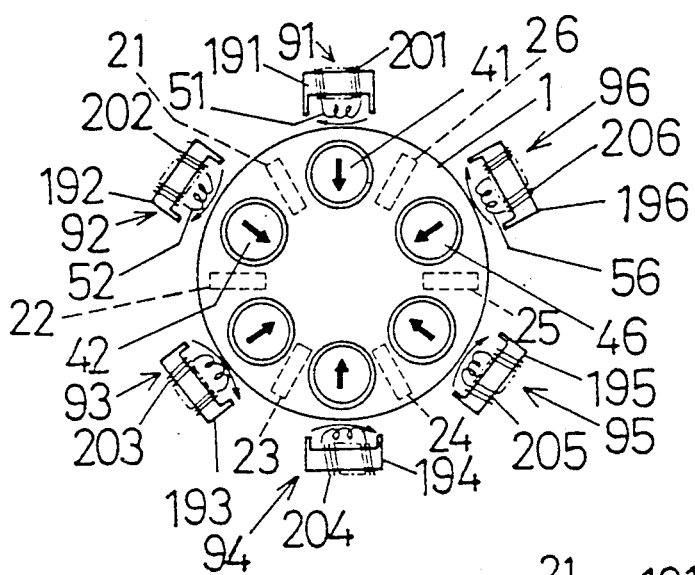
Figure 6B:
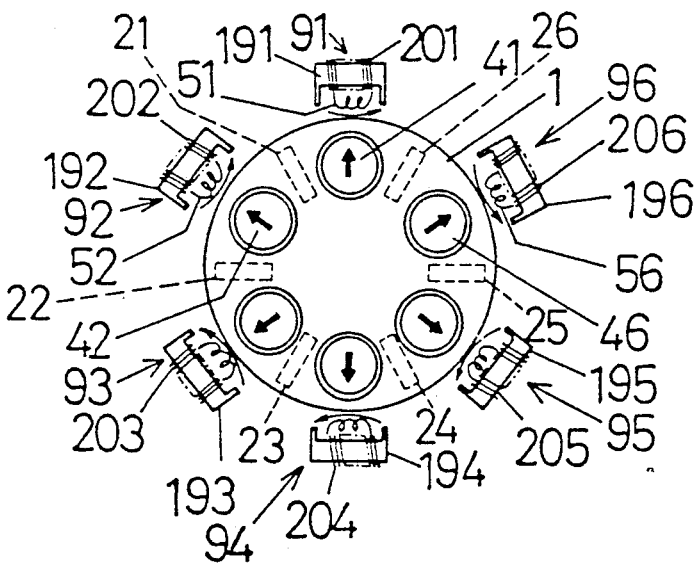

FIGS. 6a and 6b illustrate how the electron beams traveling across the respective magnetic fields produced by the respective electromagnetic coil winding assemblies 91, etc. will be influenced by the respective sweeping action, and will then be swept toward the particular directions in which the magnetic lines of force are developed across the resepective magnetic fields, as indicated by the respective arrows.

As described above, the embodiment shown in FIG. 6 includes the individual coil windings on the respective independent yoke members are functionally independent of each other, and each is associated with the corresponding electron beam supply source. Thus, each individual coil winding may provide the sweeping action for each electron beam from the respective corresponding supply source 51, 52, ... 56, and each electron beam may be influenced by the magnetic field developed by the repsective individual coil winding, in order to be swept toward the appropriate point within the respective corresponding crucible.

In all of the preferred embodiments of the present invention that have been described so far, the electromagnetic coil winding assembly included in the electron gun arrangement for providing the sweeping function for sweeping the electron beams to onepoint to any desired locations consists of a yoke that is generally made of a bulk of ferromagnetic material such as pure iron, the yoke carrying a conductor coil winding. A current flow through the coil winding may induce an eddy current in the yoke, which results in a power loss. This power loss may be increased with the higher sweeping frequencies, and therefore the higher-velocity sweeping action cannot be achieved.

When a substance to be processed is of any insulator type, and when an electron beam is to be swept by the sweeping action provided by the sweeping electromagnetic coil winding assembly at the velocity of 100 to 200 Hz, the insulator substance will have its surface charged locally by the electrons. In some extreme cases, the electron beams might fail to impinge upon any point on the surface, or might only concentrate upon one point. For the latter case, the "pit formation effect" might occur, causing a pit to be formed at the single location on the surface of the substance to be processed.

Conceivably, it may be possible that the sweeping velocity is greater than the velocity mentioned above, thereby preventing the surface of the substance from being charged locally by the electron beams. If the current flow through the sweeping electromagnetic coil winding assembly has its frequency increased to provide the greater sweeping velocity, it will increase the eddy current loss. This may produce the more amount of heat, reducing the efficiency of the coil winding and reducing the amount of sweep that can otherwise be achieved.

The embodiment of the electron gun arrangement that will be described below include means for avoiding the above drawback, thereby enabling the electron beam to be swept with a high velocity and thus enhansing the efficiency of the coil windings.

The means that is included in the present embodiment is implemented by a specially designed yoke, which consists of laminated grain-oriented magnetic silicon steel plates or sheets electrically isolated from each other. This yoke carries a coil winding.

In accordance with the electron gun arrangement including such means, the production of the eddy current in the sweeping coil winding can be reduced, with the result that the efficiency of the coil winding can be enhanced and the amount of the produced heat can be descreased. Thus, any high-frequency current may flow through the coil winding in order to provide the sweeping action for the electron beams.

Figure 9:
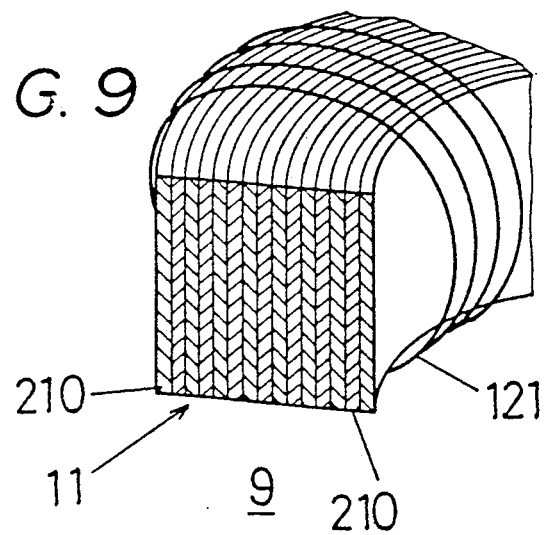
FIG. 9 is a perspective view showing some parts, as broken away, of an electromagnetic coil winding assembly consisting of laminated grain-oriented magnetic Si-steel sheets that provides the sweeping function.

In FIG. 9, part of the electromagnetic coil winding assembly 9 in the embodiment shown in FIG. 1 is shown. As shown, the coil winding assembly 9 comprises a single annular yoke 11 which consists of grain-oriented magnetic silicon steel sheets 210 (each being 0.1 mm thick, GT-100) which are laminated and are electrically isolated from each other.

In the electron gun arrangement that includes the electromagnetic coil winding assembly 9 as described above, the electron beams that have been emitted from the respective accelerator electron beam supply sources 51, 52, . . . 54 are first influenced by the deflecting magnetic fields developed by the magnetic circuit 3, following the respective paths defined as shown by 15 in FIG. 2 and then traveling toward the central areas within the respective crucibles 41, 42, . . . 44. Then, when the individual coil windings 121, 122, . . . 124 on the sweeping electromagnetic coil winding assembly 9 are energized, they produce the respective magnetic fields which act upon the electron beams traveling across the magnetic fields, so that the electron beams can pinpoint to the appropriate locations, respectively, depending upon the particular directions and magnitudes of the magnetic fields then developed by the individual coil windings, in the manner as described with reference to FIG. 8.

The single annular yoke assembly 11 can provide the magnetic force that is equal to 20% greater than that provided by the annular core formed from pure iron (SUY), and can reduce the amount of produced heat by about 1/5 as compared with the annular core. These are the effects that were demonstrated by the exepriment.

The evaporation and depositing process proceeds with a substance or substances such as insulator, high-fusing point materials, and the like placed in one or more or all of the crucibles 41, 42, . . . 44, during which an AC current flows through the coil windings 121, 122, . . . 124 that provides the respective magnetic lines of force. By varying the directions of those magnetic lines of force, the electron beams traveling across the magnetic lines of force may be swept to pinpoint to the appropriate locations.

With the sweeping electromagnetic coil winding assembly including the annular core formed by the pure iron, the maximum frequency requirements for the current flow that can provide the sweeping action are limited to 200 Hz, and the eddy current loss would be increasing at any frequencies above 200 Hz. The sweeping action could not be achieved. With the sweeping electromagnetic coil winding assembly 9 including the anuular yoke 11 as shown in FIG. 9, the maximum frequency requirements for the current flow can be increased up to 500 Hz, and the sweeping action can be achieved at this maximum frequency. Even for the insulator substance, the evaporation and deposition process can proceed successfully without causing the "pit formation effect". This is presumably because the insulator substance behaves like a kind of dielectric capacitor. When a particular point on the dielectric surface is exposed to the electron beam, the surface at that point becomes charged, and the charge is stored there. The stored charge will cause a pit to be formed at that point, but this can be avoided by moving the electron beam from that particular point to another point before the surface at the particular point becomes charged.

In this embodiment, the annular yoke 11 that forms the sweeping electromagnetic coil winding assembly 9 has an inner diameter of 150 mm and an outer diameter of 160 mm. Each of the coil windings 121, 122, . . . 124 has 200 turns, through which a current of 1.5 A (effective value) flows.

As for the embodiment described above that includes the annular yoke 11 composed of the grain-oriented magnetic silicon steel sheets, each of the yokes 161 to 164 and 191 to 196 in the preceding embodiments shown in FIGS. 4, 5, and 6 may also comprise the grain-oriented magnetic silicon steel sheets, and each yoke may carry a coil winding. In this way, a sweeping electromagnetic coil winding assembly may be provided for each yoke, which may provide the similar sweeping action as for the embodiment shown in FIG. 9.

For all of the embodiments and the variations thereof where the yoke or individual yoke members comprise the grain-oriented magnetic silicon steel sheets each electrically isolated, the eddy current loss that may be produced from the sweeping coil windings on that or those yokes can be effectively reduced. Thus, each coil winding provides its maximum performance with its maximum efficiency. Each coil winding also allows a high-frequency current to flow through it, and therefore the high-velocity sweeping action can be achieved. There is no "pit formation effect" even for the insulator substance, for which the evaporation and deposition process can occur with high reliablity.

The various preferred embodiments and some possible variations thereof have been described so far. As it may be appreciated, the present invention provides the sweeping function that allows the electron beam to pinpoint variably to any locations on the substance within the crucible. Substances to which the present invention may apply can include high-fusing point metals, insulator, sublimates, and the like. Thus, the multiple-element electron beam evaporation can be provided.

In the particular embodiments where the yoke or yoke member comprises the grain-oriented magnetic silicon steel sheets for forming the sweeping electromagnetic coil winding assembly, the reduction in the eddy current loss can be achieved substantially, and this can occur with the high efficiency. Thus, the high-velocity sweeping action can advantageously be provided.

Although the present invention has been described in full detail by referring to the several embodiments thereof, it should be understood that various changes and modifications may be made without departing from the spirit and scope of the invention.

What is claimed is:

1. Electron gun arrangement for use in the electron beam evaporation process comprising:
   magnetic circuit means for forming a magnetic circuit having an annular shape in plane and operative for producing a magnetic field which deflects an electron beam when it is traveling across the magnetic field;
   a plurality of crucibles and electron beam supply sources arranged along said magnetic circuit means; and
   electromagnetic coil winding means arranged along the outside of said magnetic circuit means and operative for providing the sweeping action for the ·lectron beam.

2. Electron gun arrangement as defined in claim 1, wherein said sweeping electromagnetic coil winding means includes a single annular yoke and two or more pairs of coil windings on said single annular yoke.

3. Electron gun arrangement as defined in claim 2, wherein said single annular yoke comprises a plurality of grain-oriented magnetic silicon steel sheets laminated and electrically isolated from each other.

4. Electron gun arrangement as defined in claim 1, wherein said sweeping electromagnetic coil winding means includes a plurality of individual yoke members combined together into an annular yoke assembly, and a coil winding on each of said individual yoke members.

5. Electron gun arrangement as defined in claim 4, wherein each of said individual yoke members comprises a plurality of grain-oriented magnetic silicon steel sheets laminated and electrically isolated from each other.

6. Electron gun arrangement as defined in claim 1, wherein said sweeping electromagnetic coil winding means includes individual yokes each arranged to face opposite each respective one of the electron beam supply sources, and a coil winding on each of said individual yokes.

7. Electron gun arrangement as defined in claim 6, wherein each of said individual yokes comprises a plurality of grain-oriented magnetic silicon steel sheets laminated and electrically isolated from each other.

* * * * *